(12) United States Patent
Sun et al.

(10) Patent No.: US 12,512,447 B2
(45) Date of Patent: Dec. 30, 2025

(54) SEMICONDUCTOR PACKAGE ASSEMBLY AND MANUFACTURING METHOD

(71) Applicant: CHANGXIN MEMORY TECHNOLOGIES, INC., Hefei (CN)

(72) Inventors: Xiaofei Sun, Hefei (CN); Changhao Quan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 555 days.

(21) Appl. No.: 17/951,722

(22) Filed: Sep. 23, 2022

(65) Prior Publication Data

US 2024/0014188 A1   Jan. 11, 2024

Related U.S. Application Data

(63) Continuation of application No. PCT/CN2022/110774, filed on Aug. 8, 2022.

(30) Foreign Application Priority Data

Jul. 8, 2022   (CN) .......................... 202210806367.7

(51) Int. Cl.
*H01L 25/10* (2006.01)
*H01L 21/48* (2006.01)
(Continued)

(52) U.S. Cl.
CPC ........ *H01L 25/105* (2013.01); *H01L 21/4857* (2013.01); *H01L 21/565* (2013.01);
(Continued)

(58) Field of Classification Search
CPC . H01L 25/105; H01L 21/4857; H01L 21/565; H01L 23/3128; H01L 23/3142;
(Continued)

(56) References Cited

U.S. PATENT DOCUMENTS

| 7,026,709 B2 | 4/2006 | Tsai et al. |
| 7,354,800 B2 * | 4/2008 | Carson ................ H01L 25/0652 257/730 |

(Continued)

FOREIGN PATENT DOCUMENTS

| CN | 1731917 A | 2/2006 |
| CN | 101075596 A | 11/2007 |

(Continued)

OTHER PUBLICATIONS

International Search Report dated Dec. 22, 2022 for Application No. PCT/CN2022/110774.

(Continued)

*Primary Examiner* — Marlon T Fletcher
*Assistant Examiner* — Christina A Sylvia
(74) *Attorney, Agent, or Firm* — Kilpatrick Townsend & Stockton LLP

(57) ABSTRACT

A semiconductor package assembly and manufacturing method are provided. The assembly includes: a base plate having a first surface; a chip stacking structure located on the base plate, the chip stacking structure including multiple chips sequently stacked in a direction perpendicular to the base plate and being electrically connected to the first surface; an interposer located on the chip stacking structure and having a first interconnection surface, the first interconnection surface having first and second interconnection regions, and the first interconnection region being electrically connected to the base plate; and a molding compound sealing the chip stacking structure, interposer and first surface. The first interconnection region is not sealed by the molding compound and the second interconnection region is sealed by the compound. There is a preset height between a top surface of the molding compound on the second interconnection region and the first interconnection region.

14 Claims, 4 Drawing Sheets

(51) Int. Cl.
    *H01L 21/56*     (2006.01)
    *H01L 23/00*     (2006.01)
    *H01L 23/31*     (2006.01)
    *H01L 23/498*    (2006.01)
    *H01L 23/552*    (2006.01)

(52) U.S. Cl.
    CPC ...... *H01L 23/3128* (2013.01); *H01L 23/3142* (2013.01); *H01L 23/315* (2013.01); *H01L 23/49816* (2013.01); *H01L 23/49822* (2013.01); *H01L 23/49833* (2013.01); *H01L 23/49838* (2013.01); *H01L 23/552* (2013.01); *H01L 24/16* (2013.01); *H01L 24/32* (2013.01); *H01L 24/48* (2013.01); *H01L 24/73* (2013.01); *H01L 2224/16227* (2013.01); *H01L 2224/32145* (2013.01); *H01L 2224/32225* (2013.01); *H01L 2224/48095* (2013.01); *H01L 2224/48227* (2013.01); *H01L 2224/73215* (2013.01); *H01L 2224/73265* (2013.01); *H01L 2225/1023* (2013.01); *H01L 2225/1041* (2013.01); *H01L 2225/1058* (2013.01); *H01L 2225/1088* (2013.01); *H01L 2924/1436* (2013.01); *H01L 2924/3025* (2013.01)

(58) Field of Classification Search
    CPC .............. H01L 23/315; H01L 23/49816; H01L 23/49822; H01L 23/49833; H01L 23/49838; H01L 23/552; H01L 24/16; H01L 24/32; H01L 24/48; H01L 24/73; H01L 2224/16227; H01L 2224/32145; H01L 2224/32225; H01L 2224/48095; H01L 2224/48227; H01L 2224/73215; H01L 2224/73265; H01L 2225/1023; H01L 2225/1041; H01L 2225/1058; H01L 2225/1088; H01L 2924/1436; H01L 2924/3025; H01L 24/97; H01L 2225/06537; H01L 21/561; H01L 21/568; H01L 2224/92247; H01L 24/45; H01L 24/92; H01L 2225/06562; H01L 2924/15311; H01L 25/50; H01L 25/0657; H01L 2225/0651; H01L 23/3185; H01L 2225/107

See application file for complete search history.

(56) References Cited

U.S. PATENT DOCUMENTS

| | | | |
|---|---|---|---|
| 7,800,211 | B2 | 9/2010 | Yang et al. |
| 8,227,925 | B2 | 7/2012 | Song et al. |
| 11,211,334 | B2 | 12/2021 | Lin et al. |
| 2004/0145039 | A1 | 7/2004 | Shim et al. |
| 2005/0023657 | A1 | 2/2005 | Tsai et al. |
| 2008/0227238 | A1 | 9/2008 | Ko et al. |
| 2009/0001540 | A1 | 1/2009 | Yang et al. |
| 2009/0079091 | A1 | 3/2009 | Song et al. |
| 2009/0085225 | A1 | 4/2009 | Park |
| 2009/0091015 | A1 | 4/2009 | Shen et al. |
| 2009/0236718 | A1 | 9/2009 | Yang et al. |
| 2009/0243068 | A1 | 10/2009 | Kuan et al. |
| 2010/0046183 | A1 | 2/2010 | Park et al. |
| 2010/0072593 | A1* | 3/2010 | Kim .................. H01L 24/73 257/676 |
| 2010/0148354 | A1 | 6/2010 | Choi et al. |
| 2010/0244221 | A1 | 9/2010 | Ko et al. |
| 2010/0258930 | A1 | 10/2010 | Oh |
| 2011/0062591 | A1 | 3/2011 | Choi et al. |
| 2011/0127662 | A1 | 6/2011 | Yang et al. |
| 2011/0133325 | A1 | 6/2011 | Moon et al. |
| 2012/0146243 | A1 | 6/2012 | Song et al. |
| 2012/0217645 | A1 | 8/2012 | Pagaila |
| 2012/0319267 | A1 | 12/2012 | Moon et al. |
| 2013/0075889 | A1 | 3/2013 | Pagaila et al. |
| 2014/0103527 | A1 | 4/2014 | Marimuthu et al. |
| 2014/0291821 | A1 | 10/2014 | Song |
| 2015/0102506 | A1 | 4/2015 | Song et al. |
| 2015/0115466 | A1 | 4/2015 | Kim |
| 2015/0270232 | A1 | 9/2015 | Chen et al. |
| 2016/0172337 | A1 | 6/2016 | Kim |
| 2017/0141043 | A1 | 5/2017 | Park |
| 2017/0228529 | A1 | 8/2017 | Huang et al. |
| 2018/0005974 | A1 | 1/2018 | Chiu et al. |
| 2019/0013299 | A1 | 1/2019 | Lee |
| 2019/0252772 | A1* | 8/2019 | Ndip .................. H01Q 1/02 |
| 2019/0296002 | A1 | 9/2019 | Pei et al. |
| 2019/0378826 | A1 | 12/2019 | Kim |
| 2020/0020637 | A1 | 1/2020 | Kim et al. |
| 2020/0066663 | A1 | 2/2020 | Aleksov et al. |
| 2020/0168583 | A1 | 5/2020 | Chen et al. |
| 2020/0194331 | A1* | 6/2020 | Kim .................. H01L 25/0657 |
| 2020/0312783 | A1 | 10/2020 | Min et al. |
| 2020/0381406 | A1 | 12/2020 | Dominguez et al. |
| 2021/0035895 | A1 | 2/2021 | Oh et al. |
| 2021/0035913 | A1 | 2/2021 | Park et al. |
| 2021/0343617 | A1 | 11/2021 | Kim et al. |
| 2021/0351172 | A1 | 11/2021 | Pei et al. |
| 2022/0122896 | A1 | 4/2022 | Wang et al. |
| 2022/0199593 | A1 | 6/2022 | Yang et al. |
| 2023/0052194 | A1 | 2/2023 | Kim et al. |

FOREIGN PATENT DOCUMENTS

| | | |
|---|---|---|
| CN | 204102862 U | 1/2015 |
| CN | 103219296 B | 4/2016 |
| CN | 107527877 A | 12/2017 |
| CN | 104576557 B | 8/2018 |
| CN | 110581121 A | 12/2019 |
| CN | 110718528 A | 1/2020 |
| CN | 110797325 A | 2/2020 |
| CN | 111819689 A | 10/2020 |
| CN | 113113318 A | 7/2021 |
| CN | 114664761 A | 6/2022 |
| JP | 60160645 A | 8/1985 |
| JP | 2002217331 A | 8/2002 |
| JP | 2004172157 A | 6/2004 |
| JP | 2005026680 A | 1/2005 |
| JP | 2010212605 A | 9/2010 |
| JP | 2010278318 A | 12/2010 |
| JP | 2011233672 A | 11/2011 |
| KR | 20090091486 A | 8/2009 |
| KR | 20090091487 A | 8/2009 |
| KR | 20170094483 A | 8/2017 |
| KR | 20180004658 A | 1/2018 |
| KR | 20190093194 A | 8/2019 |
| KR | 20210016216 A | 2/2021 |
| TW | 201314812 A | 4/2013 |
| TW | 201415586 A | 4/2014 |
| TW | 201532234 A | 8/2015 |
| TW | 202042355 A | 11/2020 |
| TW | 202044520 A | 12/2020 |
| TW | 202101685 A | 1/2021 |
| TW | 202121513 A | 6/2021 |
| TW | 202125725 A | 7/2021 |
| TW | 202129904 A | 8/2021 |
| TW | 202209581 A | 3/2022 |
| TW | M627599 U | 6/2022 |

OTHER PUBLICATIONS

First Office Action of the Taiwanese application No. 111141161, issued on Jun. 28, 2023, 8 pages with English abstract.
The office action issued in Japan corresponding application 2022-562492, mailed on Jan. 7, 2025.
Korean Intellectual Property Office, Office Action Issued in Application No. 10-2022-7041847, Mar. 29, 2024, 16 pages.
Korean Intellectual Property Office, Office Action Issued in Application No. 10-2022-7040844, Mar. 29, 2024, 16 pages.
European Patent Office, Extended European Search Report Issued in Application No. 22790428.1, May 22, 2024, Germany, 17 pages.

(56) References Cited

OTHER PUBLICATIONS

Japanese Patent Office, Office Action Issued in Application No. 2022-562492, Sep. 3, 2024, 2 pages.
Japanese Patent Office, Office Action Issued in Application No. 2022-563494, Oct. 1, 2024, 9 pages.
Japanese Patent Office, Office Action Issued in Application No. 2022-566266, Oct. 8, 2024, 10 pages.
Japanese Patent Office, Office Action Issued in Application No. 2022-562587, Oct. 15, 2024, 8 pages.
Decision of Refusal issued in Japanese corresponding application No. 2022-562492 mailed on Apr. 22, 2025, 8 pages.
Search Report issued in Singaporean corresponding application No. 11202254069A mailed on May 23, 2025, 2 pages.
Written Opinion issued in Singaporean corresponding application No. 11202254069A mailed on Jun. 26, 2025, 7 pages.
Search Report issued in Singaporean corresponding application No. 11202254497Y mailed on Jun. 3, 2025, 4 pages.
Written Opinion issued in Singaporean corresponding application No. 11202254497Y mailed on Jun. 5, 2025, 8 pages.
Non-final Office Action issued in corresponding U.S. Appl. No. 18/152,188 mailed on May 20, 2025, 14 pages.
Non-final Office Action issued in U.S. Appl. No. 17/952,404 mailed on Sep. 23, 2025, 11 pages.
Non-final Office Action issued in U.S. Appl. No. 18/166,465 mailed on Oct. 2, 2025, 7 pages.
The Communication pursuant to Article 94(3) EPC issued in European corresponding application No. 22793375.1 mailed on Oct. 15, 2025, 5 pages.

* cited by examiner

SEMICONDUCTOR PACKAGE ASSEMBLY AND MANUFACTURING METHOD

CROSS-REFERENCE TO RELATED APPLICATION

The application is a continuation application of International Patent Application No. PCT/CN2022/110774, filed on Aug. 8, 2022, which is based upon and claims priority to Chinese Patent Application No. 202210806367.7, filed on Jul. 8, 2022, and entitled "SEMICONDUCTOR PACKAGE ASSEMBLY AND MANUFACTURING METHOD", the disclosure of which is hereby incorporated by reference in its entirety.

BACKGROUND

All sectors, industries and regions continually require lighter, faster, smaller, more functional, more reliable and more cost-effective products in the electronics industry. In order to meet these growing requirements of many different consumers, more circuits are required to be integrated to provide required functions. In almost all applications, there is a growing requirement for reduced sizes, enhanced performance and improved functions of the integrated circuits.

SUMMARY

In view of this, embodiments of the disclosure provide a semiconductor package assembly and a manufacturing method.

A first aspect of an embodiment of the disclosure provides a semiconductor package assembly, including a base plate, a chip stacking structure, an interposer and a molding compound. The base plate has a first surface. The chip stacking structure is located on the base plate. The chip stacking structure includes a plurality of chips sequently stacked in a direction perpendicular to the base plate, and is electrically connected to the first surface of the base plate. The interposer is located on the chip stacking structure and has a first interconnection surface. The first interconnection surface has a first interconnection region and a second interconnection region. The first interconnection region is electrically connected to the base plate. The molding compound seals the chip stacking structure, the interposer and the first surface of the base plate. The first interconnection region is not sealed by the molding compound, and the second interconnection region is sealed by the molding compound. There is a preset height between a top surface of the molding compound on the second interconnection region and the first interconnection region.

In some embodiments, the semiconductor package assembly further includes a first conductive wire and a second conductive wire.

Each chip is electrically connected to the base plate via the first conductive wire.

The second interconnection region is electrically connected to the base plate via the second conductive wire.

In some embodiments, the first interconnection region includes a plurality of first pads. The second interconnection region includes a plurality of second pads. The number of the second pads is greater than the number of the first pads. An area of the second pad is less than an area of the first pad.

In some embodiments, an included angle between a sidewall between the top surface of the molding compound and the first interconnection region and a direction perpendicular to the base plate is a first included angle. The first included angle is greater than or equal to 0° and less than 90°.

In some embodiments, the interposer includes a base. An electromagnetic shielding layer is provided in the base.

In some embodiments, in a direction perpendicular to the base plate, the base plate has a first thickness, and the interposer has a second thickness. The first thickness is greater than the second thickness.

In some embodiments, the semiconductor package assembly further includes a second package structure.

The second package structure includes a first solder ball. The first solder ball is electrically connected to the first interconnection region. A height of the first solder ball is greater than the preset height.

A second aspect of an embodiment of the disclosure provides a method for manufacturing a semiconductor package assembly, including the following operations.

A base plate is provided, and has a first surface.

A chip stacking structure is formed on the base plate. The chip stacking structure includes a plurality of chips sequently stacked in a direction perpendicular to the base plate, and is electrically connected to the first surface of the base plate.

An interposer is formed on the chip stacking structure. The interposer has a first interconnection surface. The first interconnection surface has a first interconnection region and a second interconnection region. The first interconnection region is electrically connected to the base plate.

A molding compound is formed. The molding compound seals the chip stacking structure, the interposer and the first surface of the base plate. The first interconnection region is not sealed by the molding compound, and the second interconnection region is sealed by the molding compound. There is a preset height between a top surface of the molding compound on the second interconnection region and the first interconnection region.

In some embodiments, the operation of forming the interposer on the chip stacking structure includes the following operation.

The interposer is provided. A bottom of the interposer is provided with an adhesive layer. The interposer is adhered to the chip stacking structure via the adhesive layer.

In some embodiments, the method further includes the following operations.

The interposer is formed.

A first conductive wire is formed. Each chip is electrically connected to the base plate via the first conductive wire.

A second conductive wire is formed. The second interconnection region is electrically connected to the base plate via the second conductive wire.

In some embodiments, the method includes the following operation.

A plurality of first pads are formed on the first interconnection region, and a plurality of second pads are formed on the second interconnection region. The number of the second pads is greater than the number of the first pads. An area of the second pad is less than an area of the first pad.

In some embodiments, the method further includes the following operation.

The interposer is formed, and then a covering layer with the preset height is formed on the first interconnection region of the interposer. An included angle between a sidewall of the covering layer and the direction perpendicular to the base plate is a first included angle. The first included angle is greater than or equal to 0° and less than 90°.

In some embodiments, the method further includes the following operation.

The covering layer is formed, and then a first packaging mold is formed. A surface of the first packaging mold is parallel to a surface of the base plate, is located above the covering layer, and has a certain distance from the covering layer.

In some embodiments, the method further includes the following operation.

The first packaging mold is used as a mask, to form a molding compound pre-layer sealing the chip stacking structure, the interposer, the covering layer and the first surface of the base plate.

Part of the molding compound pre-layer is removed to expose the covering layer.

The covering layer is removed to expose the first interconnection region.

In some embodiments, the method further includes the following operation.

A second package structure is formed, and a first solder ball is formed on the second package structure. The first solder ball is electrically connected to the first interconnection region. A height of the first solder ball is greater than the preset height.

BRIEF DESCRIPTION OF THE DRAWINGS

In order to more clearly illustrate the technical solutions in the embodiments of the disclosure or conventional technologies, the drawings used in the embodiments will be briefly described below. It is apparent that the drawings in the following descriptions are merely some embodiments of the disclosure. Other drawings can be conceived from those skilled in the art according to these drawings without any creative work.

Figure 1:
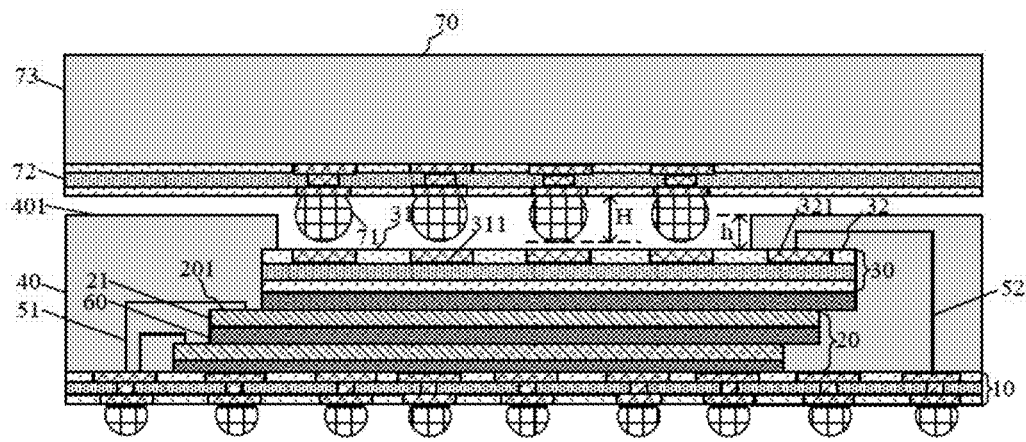
FIG. 1 is a schematic structural diagram of a semiconductor package assembly according to an embodiment of the disclosure.

In the drawings:
1—Circular ring; 2—Carrier band;
10—Base plate; 101—First surface; 102—Second surface; 11—First substrate; 12—Base plate upper insulating dielectric layer: 13—Base plate lower insulating dielectric layer; 14—Base plate upper connection pad; 15—Base plate lower connection pad; 16—Base plate connection via: 17—Base plate connection bump; 110—First signal transmission region: 120—Second signal transmission region: 130—Third signal transmission region;
20—Chip stacking structure; 21—Chip; 201—First connection end;
30—Interposer: 31—First interconnection region: 32—Second interconnection region: 301—First interconnection surface; 311—First pad; 321—Second pad: 33—Second substrate; 34—Interposer upper insulating dielectric layer; 35—Interposer lower insulating dielectric layer;
40—Molding compound; 401—Top surface; 400—Molding compound pre-layer;
51—First conductive wire: 52—Second conductive wire;
60—Adhesive film;
70—Second package structure; 71—First solder ball: 72—Second base plate; 73—Second molding compound;
80—Covering layer;
91—First packaging mold: 92—Second packaging mold.

DETAILED DESCRIPTION

Exemplary embodiments disclosed in the disclosure are described in more detail with reference to drawings. Although the exemplary embodiments of the disclosure are shown in the drawings, it is to be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout.

It is to be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It is to be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for conveniently describing so that a relationship between one element or feature shown in the drawings and other elements or features is described. It is to be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below, however, the disclosure may also have other implementations in addition to these detailed descriptions.

An embodiment of the disclosure provides a semiconductor package assembly. FIG. 1 is a schematic structural diagram of a semiconductor package assembly according to an embodiment of the disclosure.

As shown in FIG. 1, the semiconductor package assembly includes a base plate, a chip stacking structure, an interposer and a molding compound.

The base plate 10 has a first surface 101.

The chip stacking structure 20 is located on the base plate 10. The chip stacking structure 20 includes a plurality of chips 21 sequently stacked in a direction perpendicular to the base plate 10, and is electrically connected to the first surface 101 of the base plate 10.

The interposer 30 is located on the chip stacking structure 20 and has a first interconnection surface 301. The first interconnection surface 301 has a first interconnection region 31 and a second interconnection region 32. The first interconnection region 31 is electrically connected to the base plate 10.

A molding compound 40 is formed. The molding compound 40 seals the chip stacking structure 20, the interposer 30 and the first surface 101 of the base plate 10. The first interconnection region 31 is not sealed by the molding compound 40, and the second interconnection region 32 is sealed by the molding compound 40. There is a preset height h between a top surface 401 of the molding compound 40 on the second interconnection region 32 and the first interconnection region 31.

In the embodiments of the disclosure, through the arrangement of the interposer, the subsequent second package structure may be connected to the chip stacking structure and the base plate via the first interconnection region on the interposer. Therefore, the interconnection among the chip structures of different types or different specifications can be realized, so as to cause a combination among different chip structures to be more flexible. In addition, since the chip stacking structure and the second package structure subsequently connected to the chip stacking structure are packaged independently, test and failure analysis are easier to perform. Since there is the preset height between the first interconnection region of the interposer and the top surface of the molding compound, the second package structure may be placed on the first interconnection region, within a region enclosed by the molding compound, so that the height and size of the entire structure can be reduced.

Figure 2:
FIG. 2 is a schematic structural diagram of a base plate according to an embodiment of the disclosure.

FIG. 2 is a schematic structural diagram of a base plate according to an embodiment of the disclosure.

In some embodiments, the base plate 10 may be a Printed Circuit Board (PCB) or a redistribution base plate.

As shown in FIG. 2, the base plate 10 includes a first substrate 11, and a base plate upper insulating dielectric layer 12 and a base plate lower insulating dielectric layer 13 that are respectively disposed on an upper surface and a lower surface of the first substrate 11.

The first substrate 11 may be a silicon substrate, a germanium substrate, a silicon germanium substrate, a silicon carbide substrate, a Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as Silicon Germanium On Insulator (SGOI).

The base plate upper insulating dielectric layer 12 and the base plate lower insulating dielectric layer 13 may be solder mask layers. For example, materials of the base plate upper insulating dielectric layer 12 and the base plate lower insulating dielectric layer 13 may be green paint.

In this embodiment of the disclosure, the first surface 101 of the base plate 10 is an upper surface of the base plate upper insulating dielectric layer 12. The base plate 10 further includes a second surface 102, that is, a lower surface of the base plate lower insulating dielectric layer 13.

The base plate 10 further includes a base plate upper connection pad 14 located in the base plate upper insulating dielectric layer 12, a base plate lower connection pad 15 located in the base plate lower insulating dielectric layer 13, and a base plate connection via 16 that penetrates the first substrate 11 and connects the base plate upper connection pad 14 and the base plate lower connection pad 15.

Materials of the base plate upper connection pad 14 and the base plate lower connection pad 15 may include at least one of aluminum, copper, nickel, tungsten, platinum, or gold. The base plate connection via 16 may be a Through-Silicon-Via (TSV).

The base plate 10 further includes a base plate connection bump 17. The base plate connection bump 17 may electrically connect the semiconductor package assembly to an external apparatus, so that at least one of a control signal, a power signal or a grounding signal that is used to operate the chip stacking structure may be received from the external apparatus, or a data signal to be stored in the chip stacking structure may be received from the external apparatus. Alternatively, data in the chip stacking structure may also be provided to the external apparatus.

The base plate connection bump 17 includes a conductive material. In the embodiment of the disclosure, the base plate connection bump 17 is a solder ball. It is understandable that, a shape of the base plate connection bump provided in this embodiment of the disclosure is only an inferior and feasible specific implementation in the embodiments of the disclosure, and does not constitute a limitation of the disclosure. The base plate connection bump may also be a structure with other shapes. The number, spacing, and location of the base plate connection bumps are not limited to any specific arrangement, and various modifications may be made.

Also referring to FIG. 2, the base plate 10 further includes a first signal transmission region 110 and a second signal transmission region 120 that are respectively located on two opposite sides of the base plate 10. The first signal transmission region 110 is electrically connected to the chip stacking structure 20. The second signal transmission region 120 is electrically connected to the interposer 30.

The base plate 10 further includes a third signal transmission region 130 located between the first signal transmission region 110 and the second signal transmission region 120. The chip stacking structure 20 is located on the third signal transmission region 130.

Also referring to FIG. 1, the chip stacking structure 20 includes a plurality of chips 21 that are sequently stacked in a direction perpendicular to the base plate 10. In this embodiment, via sequently stacking the plurality of chips upwards, a horizontal area of the semiconductor package assembly can be saved.

In an embodiment of the disclosure, the chip may be a DRAM chip.

Figure 3:
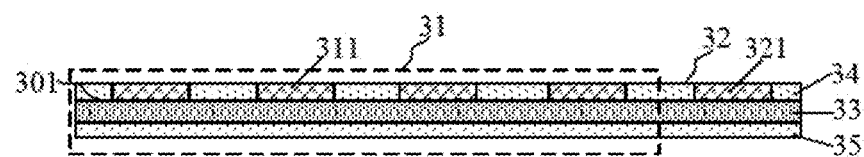
FIG. 3 is a schematic structural diagram of an interposer according to an embodiment of the disclosure.

FIG. 3 is a schematic structural diagram of an interposer according to an embodiment of the disclosure.

As shown in FIG. 3, the interposer 30 includes a second substrate 33, and an interposer upper insulating dielectric layer 34 and an interposer lower insulating dielectric layer 35 that are respectively disposed on an upper surface and a lower surface of the second substrate 33.

The second substrate 33 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The interposer upper insulating dielectric layer 34 and the interposer lower insulating dielectric layer 35 may be solder mask layers. For example, materials of the interposer upper insulating dielectric layer 34 and the interposer lower insulating dielectric layer 35 may be green paint.

In an embodiment, an electromagnetic shielding layer (not shown) is provided in the second substrate 33 of the interposer 30. By disposing the electromagnetic shielding layer in the base of the interposer, information interference between the second package structure and the chip stacking structure can be prevented from affecting the operation of devices.

The interposer 30 includes a first interconnection region 31 and a second interconnection region 32. The first interconnection region 31 includes a plurality of first pads 311, and the second interconnection region 32 includes a plurality of second pads 321. The number of the second pads 321 is greater than the number of the first pads 311. An area of the second pad 321 is less than an area of the first pad 311.

Since the first pad is required to be mated and connected to the second package structure subsequently, the layout design is relatively fixed. The first pad carries the interconnection between the second package structure and the base plate, so that the layout design is more flexible. By designing the second pad to have a large number and a smaller area, the signal transmission efficiency can be enhanced.

Materials of the first pad 311 and the second pad 321 may include at least one of aluminum, copper, nickel, tungsten, platinum, or gold.

In an embodiment, in the direction perpendicular to the base plate 10, the base plate 10 has a first thickness. The interposer 30 has a second thickness. The first thickness is greater than the second thickness.

Also referring to FIG. 1, the semiconductor package assembly further includes: a first conductive wire 51, where each chip 21 is electrically connected to the base plate 10 via the first conductive wire 51; and a second conductive wire 52. The second interconnection region 32 is electrically connected to the base plate 10 via the second conductive wire 52.

Specifically, the chip 21 has a first connection end 201. The first connection end 201 and the first signal transmission region 110 are located on the same side. The first conductive wire 51 is led out from the first connection end 201 to the first signal transmission region 110, so as to achieve an electric connection between the chip 21 and the base plate 10.

A second pad 321 is formed on the second interconnection region 32. The second conductive wire 52 is led out from the second pad 321 to the second signal transmission region 120, so as to achieve an electric connection between the interposer 30 and the base plate 10.

In this embodiment of the disclosure, the chip stacking structure is electrically connected to the base plate via wire bonding. The wire bonding manner includes an overhang manner and a Film on Wire (FOW) manner.

In the embodiment shown in FIG. 1, wire bonding is performed via the overhang manner. The two adjacent chips 21 are connected to each other via an adhesive film 60. The adhesive film 60 does not cover the first connection end 201 and the first conductive wire 51 on the chip 21 at a layer below the adhesive film. The adhesive film 60 is misaligned with the chip 21 at the layer below the adhesive film.

In some other embodiments, wire bonding (not shown) is performed via the FOW manner. The plurality of chips are aligned along a direction perpendicular to the base plate. The adhesive film between the two adjacent chips covers the first connection end and the first conductive wire on the chip at the layer below the adhesive film.

It is understandable that, in this embodiment of the disclosure, the electric connection via lead wires is only an inferior and feasible specific implementation in the embodiments of the disclosure, and does not constitute a limitation of the disclosure. The electric connection may also be achieved via other manners, for example, hybrid bonding or bump interconnection.

In an embodiment, an included angle between a sidewall between the top surface 401 of the molding compound 40 and the first interconnection region 31 and a direction perpendicular to the base plate 10 is a first included angle. The first included angle is greater than or equal to 0° and less than 90°.

For example, in the embodiment shown in FIG. 1, the included angle between the sidewall between the top surface 401 of the molding compound 40 and the first interconnection region 31 and the direction perpendicular to the base plate 10 is 0°. The sidewall between the top surface 401 of the molding compound 40 and the first interconnection region 31 is perpendicular to the base plate 10. By designing the sidewall of the molding compound into a vertical shape, a simpler process can be achieved.

Figure 4:
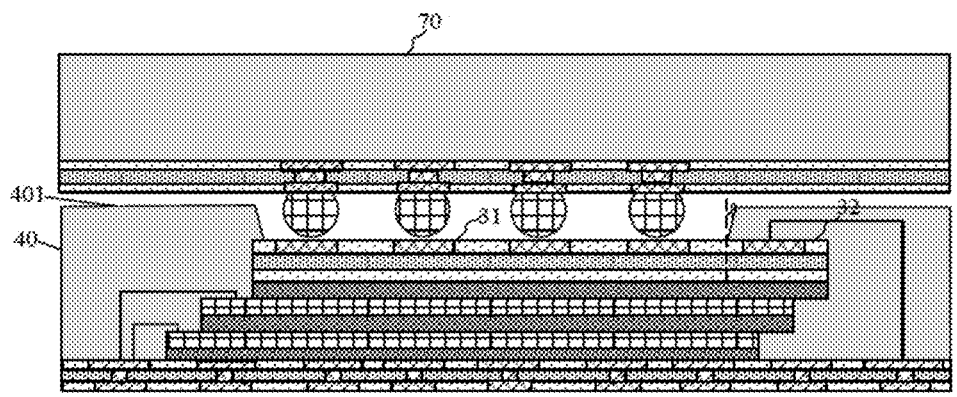
FIG. 4 is a schematic structural diagram of a semiconductor package assembly according to another embodiment of the disclosure.

In the embodiment shown in FIG. 4, the included angle between the sidewall between the top surface 401 of the molding compound 40 and the first interconnection region 31 and the direction perpendicular to the base plate 10 is a, and a is greater than 0° and less than 90°. By designing the sidewall of the molding compound into a non-vertical shape, the subsequent interconnection with the second package structure can be more convenient.

In an embodiment, the semiconductor package assembly further includes a second package structure 70. The second package structure 70 includes a first solder ball 71. The first solder ball 71 is electrically connected to the first interconnection region 31. A height H of the first solder ball 71 is greater than the preset height h.

In this embodiment of the disclosure, by designing the height of the first solder ball to be greater than the height between the top surface of the molding compound and the first interconnection region, the second package structure can be tightly connected to the interposer. In addition, after the second package structure is connected to the interposer, there may be a gap between the second package structure and the molding compound. Therefore, the heat dissipation efficiency of a controller can be enhanced, and the impact of heat on chips can be reduced.

The second package structure 70 further includes a second base plate 72. A structure of the second base plate 72 may be the same or different from a structure of the base plate 10, which is not described herein again.

In an embodiment, in the direction perpendicular to the base plate 10, the molding compound 40 has a first thickness. The second package structure 70 includes a second molding compound 73. In the direction perpendicular to the base plate 10, the second molding compound 73 has a second thickness. The first thickness is greater than or equal to the second thickness.

The second package structure 70 further includes at least one second chip structure (not show). The type of the second chip structure is the same as or different from the type of the chip 21 in the chip stacking structure 20.

In an embodiment of the disclosure, the second package structure 70 includes a plurality of stacked second chip structures. A stacking manner of each second chip structure is the same as a stacking manner of the chip 21 in the chip stacking structure 20. Through such an arrangement, the mechanical adaptability between the second package structure 70 and the chip stacking structure 20 can be improved, and the stability of the package can be enhanced.

For example, the second chip structure may be a Universal File Store (UFS) chip.

The semiconductor package assembly provided in the embodiments of the disclosure is applicable to UFS Multi Chip Package (UMCP) of a Package on Package (POP) structure.

Figure 5:
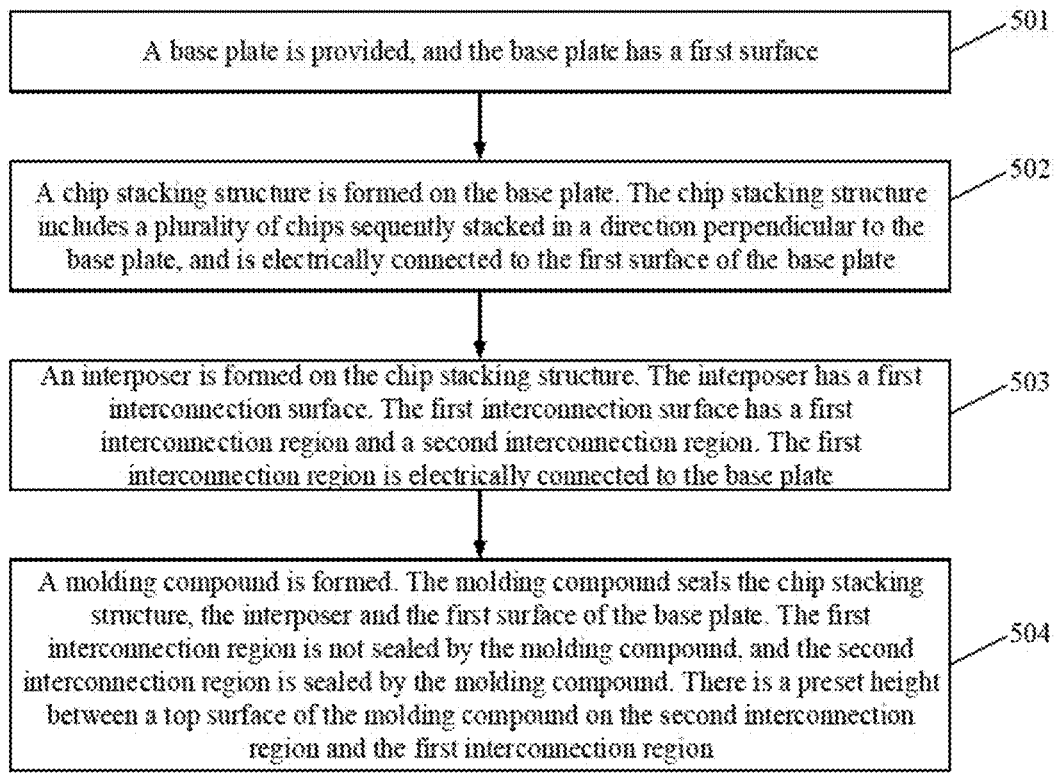
FIG. 5 is a schematic flowchart of a method for manufacturing a semiconductor package assembly according to an embodiment of the disclosure.

An embodiment of the disclosure further provides a method for manufacturing a semiconductor package assembly. Referring to FIG. 5 for details, as shown in the figure, the method includes the following steps.

At S501, a base plate is provided, and has a first surface.

At S502, a chip stacking structure is formed on the base plate. The chip stacking structure includes a plurality of chips sequently stacked in a direction perpendicular to the base plate, and is electrically connected to the first surface of the base plate.

At S503, an interposer is formed on the chip stacking structure. The interposer has a first interconnection surface. The first interconnection surface has a first interconnection region and a second interconnection region. The first interconnection region is electrically connected to the base plate.

At S504, a molding compound is formed. The molding compound seals the chip stacking structure, the interposer and the first surface of the base plate. The first interconnection region is not sealed by the molding compound, and the second interconnection region is sealed by the molding compound. There is a preset height between a top surface of the molding compound on the second interconnection region and the first interconnection region.

The method for manufacturing a semiconductor package assembly provided in the embodiments of the disclosure is further described in detail below with reference to specific embodiments.

FIG. 6A to FIG. 6I are schematic structural diagrams of a semiconductor package assembly during manufacturing according to an embodiment of the disclosure.

Figure 6A:
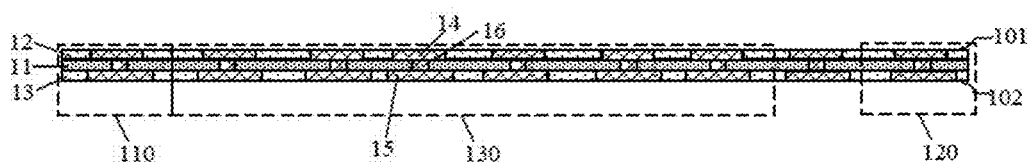
FIG. 6A to FIG. 6I are schematic diagrams of a device structure of a semiconductor package assembly during manufacturing according to an embodiment of the disclosure.

First referring to FIG. 6A, S501 of providing the base plate 10 is executed. The base plate 10 has a first surface 101.

In some embodiments, the base plate 10 may be a PCB or a redistribution base plate.

As shown in FIG. 2, the base plate 10 includes a first substrate 11, and a base plate upper insulating dielectric layer 12 and a base plate lower insulating dielectric layer 13 that are respectively disposed on an upper surface and a lower surface of the first substrate 11.

The first substrate 11 may be a silicon substrate, a germanium substrate, a silicon germanium substrate, a silicon carbide substrate, a Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as Silicon Germanium On Insulator (SGOI).

The base plate upper insulating dielectric layer 12 and the base plate lower insulating dielectric layer 13 may be solder mask layers. For example, materials of the base plate upper insulating dielectric layer 12 and the base plate lower insulating dielectric layer 13 may be green paint.

In this embodiment of the disclosure, the first surface 101 of the base plate 10 is an upper surface of the base plate upper insulating dielectric layer 12. The base plate 10 further includes a second surface 102, that is, a lower surface of the base plate lower insulating dielectric layer 13.

The base plate 10 further includes a base plate upper connection pad 14 located in the base plate upper insulating dielectric layer 12, a base plate lower connection pad 15 located in the base plate lower insulating dielectric layer 13, and a base plate connection via 16 that penetrates the first substrate 11 and connects the base plate upper connection pad 14 and the base plate lower connection pad 15.

Materials of the base plate upper connection pad 14 and the base plate lower connection pad 15 may include at least one of aluminum, copper, nickel, tungsten, platinum, or gold. The base plate connection via 16 may be a Through-Silicon-Via (TSV).

The base plate 10 further includes a first signal transmission region 110 and a second signal transmission region 120 that are respectively located on two opposite sides of the base plate 10. The first signal transmission region 110 is electrically connected to the chip stacking structure 20 formed subsequently. The second signal transmission region 120 is electrically connected to the interposer 30 formed subsequently.

In some embodiments, the first signal transmission region 110 and the second signal transmission region 120 are not connected to each other.

The base plate 10 further includes a third signal transmission region 130 located between the first signal transmission region 110 and the second signal transmission region 120. The chip stacking structure 20 is subsequently formed on the third signal transmission region 130.

In some embodiments, the first signal transmission region 110 and the third signal transmission region 130 are connected to each other. The third signal transmission region 130 and the second signal transmission region 120 are not connected to each other.

Figure 6B:
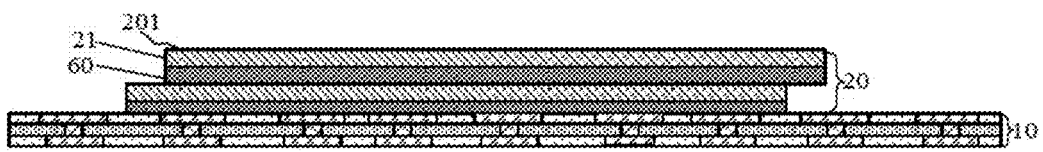

Next, referring to FIG. 6B, S502 of forming the chip stacking structure 20 on the base plate 10. The chip stacking structure 20 includes a plurality of chips 21 sequently stacked in a direction perpendicular to the base plate 10, and is electrically connected to the first surface 101 of the base plate 10.

In this embodiment of the disclosure, via sequently stacking the plurality of chips upwards, a horizontal area of the semiconductor package assembly can be saved.

The two adjacent chips 21 are connected to each other via the adhesive film 60. The chip stacking structure 20 is connected to the first base plate 10 via the adhesive film 60. In an embodiment of the disclosure, the adhesive film 60 may be DAF.

Figure 6C:
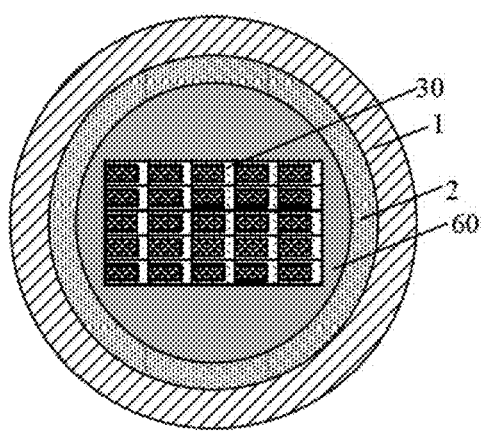
Figure 6D:
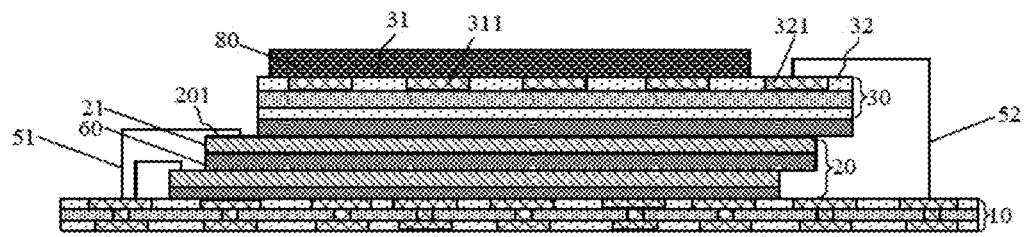

Next, referring to FIG. 6C to FIG. 6D, S503 of forming the interposer 30 on the chip stacking structure 20. The interposer 30 has a first interconnection surface 301. The first interconnection surface 301 has a first interconnection region 31 and a second interconnection region 32. The first interconnection region 31 is electrically connected to the base plate 10.

Specifically, referring to FIG. 6C first, a carrier band 2 is pasted on a circular ring 1. The adhesive film 60 is then pasted on the carrier band 2. Then, the interposer is pasted on the adhesive film 60. In this case, the entire interposer is in a strip shape. The interposer is cut to form units one by one shown in FIG. 6C.

Referring to FIG. 6C and FIG. 6D, after the interposer 30 is formed, and then a covering layer 80 with the preset height h in the direction perpendicular to the base plate 10 is formed on the first interconnection region 31 of the interposer 30. An included angle between a sidewall of the covering layer 80 and the direction perpendicular to the base plate 10 is a first included angle. The first included angle is greater than or equal to 0° and less than 90°.

In an embodiment of the disclosure, a material of the covering layer may be polyimide, a polyester material, or a polyethylene terephthalate film.

In the embodiment shown in FIG. 6D, the included angle between the sidewall of the covering layer 80 and the direction perpendicular to the base plate 10 is 0°. A structure of the formed molding compound is shown in FIG. 1. In other embodiments, the included angle between the sidewall of the covering layer and the direction perpendicular to the base plate is greater than 0° and less than 90°. The structure of the formed molding compound is shown in FIG. 4.

In this embodiment of the disclosure, by forming the covering layer on the first interconnection region of the interposer, after the molding compound is formed subsequently, the pollution of the molding compound to the first interconnection region during plastic sealing can be prevented, and an exposed height of the first interconnection region on the interposer 30 can also be set on the interposer 30 via the covering layer with a preset thickness, so that the preset height of the first interconnection region can be designed more flexibility. In addition, by using the covering layer, a special-shaped packaging mold is not required to be used during plastic sealing, but the first interconnection region can be exposed via directly removing the covering layer. Therefore, cost can be reduced, and a formation process can be simpler as well.

After the covering layer 80 is formed, the interposer attached to the circular ring 1 is required to be cleaned to remove impurities and dust, so as to prevent the interposer from being dirty and affecting the performance of the semiconductor package assembly.

Next, referring to FIG. 6D, the interposer 30 is formed on the chip stacking structure 20.

Specifically, the interposer 30 is separated from the carrier band 2. The interposer 30 is adhered to the chip on the top of the chip stacking structure 20 by using the adhesive film 60 at the bottom of the interposer 30.

As shown in FIG. 3, the interposer 30 includes a second substrate 33, and an interposer upper insulating dielectric layer 34 and an interposer lower insulating dielectric layer 35 that are respectively disposed on an upper surface and a lower surface of the second substrate 33.

The second substrate 33 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The interposer upper insulating dielectric layer 34 and the interposer lower insulating dielectric layer 35 may be solder mask layers. For example, materials of the interposer upper insulating dielectric layer 34 and the interposer lower insulating dielectric layer 35 may be green paint.

In an embodiment, an electromagnetic shielding layer (not shown) is provided in the second substrate 33 of the interposer 30. By disposing the electromagnetic shielding layer in the base of the interposer, information interference between the second package structure and the chip stacking structure can be prevented from affecting the operation of devices.

Also referring to FIG. 6D, the method further includes: forming a plurality of first pads 311 on the first interconnection region 31, and forming a plurality of second pads 321 on the second interconnection region 32. The number of the second pads 321 is greater than the number of the first pads 311. An area of the second pad 321 is less than an area of the first pad 311.

Since the first pad is required to be mated and connected to the second package structure subsequently, the layout design is relatively fixed. The first pad carries the interconnection between the second package structure and the base plate, so that the layout design is more flexible. By designing the second pad to have a large number and a smaller area, the signal transmission efficiency can be enhanced.

The first pad 311 and the second pad 321 are located in the interposer upper insulating dielectric layer 34.

Materials of the first pad 311 and the second pad 321 may include at least one of aluminum, copper, nickel, tungsten, platinum, or gold.

In an embodiment, in the direction perpendicular to the base plate 10, the base plate 10 has a first thickness. The interposer 30 has a second thickness. The first thickness is greater than the second thickness.

Also referring to FIG. 6D, the method further includes: forming the interposer 30.

Then, a first conductive wire 51 is formed. Each chip 21 is electrically connected to the base plate 10 via the first conductive wire 51.

A second conductive wire 52 is formed. The second interconnection region 32 is electrically connected to the base plate 10 via the second conductive wire 52.

Specifically, the chip 21 has a first connection end 201. The first connection end 201 and the first signal transmission region 110 are located on the same side. The first conductive wire 51 is led out from the first connection end 201 to the first signal transmission region 110, so as to achieve an electric connection between the chip 21 and the base plate 10.

A second pad 321 is formed on the second interconnection region 32. The second conductive wire 52 is led out from the second pad 321 to the second signal transmission region 120, so as to achieve an electric connection between the interposer 30 and the base plate 10. In this embodiment of the disclosure, the chip stacking structure is electrically connected to the base plate via wire bonding. The wire bonding manner includes an overhang manner and a Film on Wire (FOW) manner.

In the embodiment shown in FIG. 6D, wire bonding is performed via the overhang manner. The two adjacent chips 21 are connected to each other via an adhesive film 60. The adhesive film 60 does not cover the first connection end 201 and the first conductive wire 51 on the chip 21 at a layer below the adhesive film. The adhesive film 60 is misaligned with the chip 21 at the layer below the adhesive film.

In some other embodiments, wire bonding (not shown) is performed via the FOW manner. The plurality of chips are aligned along a direction perpendicular to the base plate. The adhesive film between the two adjacent chips covers the first connection end and the first conductive wire on the chip at the layer below the adhesive film.

Next, referring to FIG. 6E to FIG. 6H, S504 of forming the molding compound 40 is executed. The molding compound 40 seals the chip stacking structure 20, the interposer 30 and the first surface 101 of the base plate 10. The first interconnection region 31 is not sealed by the molding compound 40, and the second interconnection region 32 is sealed by the molding compound 40. There is a preset height h between a top surface 401 of the molding compound 40 on the second interconnection region 32 and the first interconnection region 31.

Figure 6E:
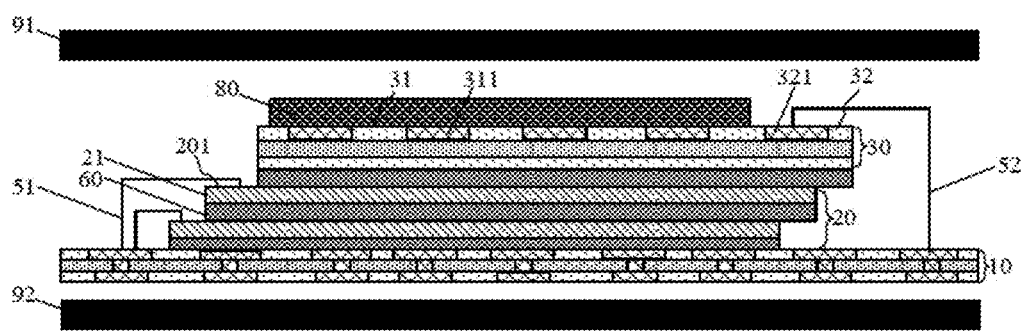

Specifically, referring to FIG. 6E first, the method further includes: forming the covering layer 80, and then forming a first packaging mold 91. A surface of the first packaging mold 91 is parallel to a surface of the base plate 10, is located above the covering layer 80, and has a certain distance from the covering layer 80.

Also referring to FIG. 6E, the method further includes forming a second packaging mold 92. The second packaging mold 92 is located under the first base plate 10, and is parallel to the surface of the first base plate 10.

Figure 6F:
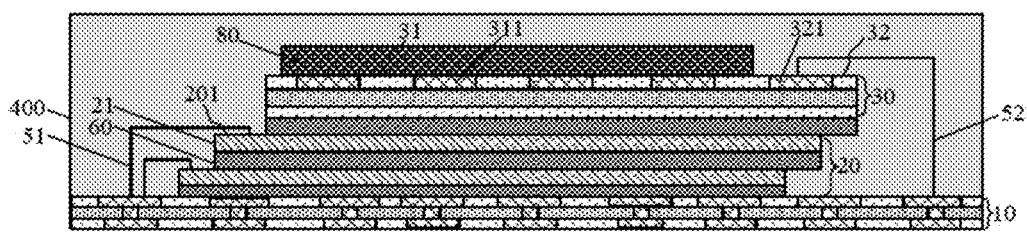

Next, referring to FIG. 6F, the method further includes: using the first packaging mold 91 as a mask, to form a molding compound pre-layer 400 sealing the chip stacking structure 20, the interposer 30, the covering layer 80 and the first surface 101 of the base plate 10.

Specifically, the first packaging mold 91 and the second packaging mold 92 are used as masks, to form the molding compound pre-layer 400.

After the molding compound pre-layer 400 is formed, the first packaging mold 91 and the second packaging mold 92 are removed.

Figure 6G:
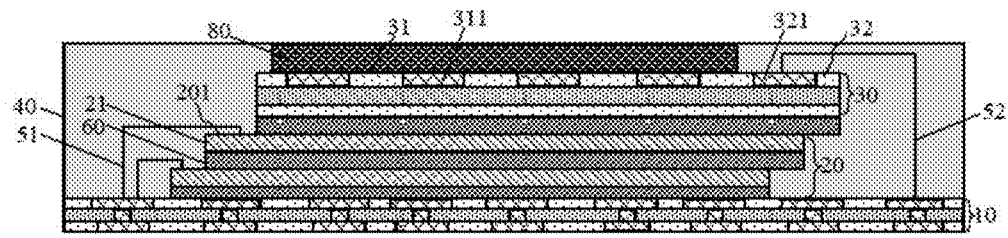

Next, referring to FIG. 6G, part of the molding compound pre-layer 400 is removed to expose the covering layer 80.

Specifically, the surface of the molding compound pre-layer 400 may be polished by using a grinding wheel, to remove part of the molding compound pre-layer 400, so as to form the molding compound 40. In an embodiment of the disclosure, the molding compound 40 may be EMC.

In an embodiment of the disclosure, after removing the first packaging mold 91 and second packaging mold 92, the method further includes removing the molding compound pre-layer under the base plate, to expose the second surface of the base plate.

In an embodiment of the disclosure, after the molding compound pre-layer under the base plate is removed to expose the second surface of the base plate, part of the molding compound pre-layer on the interposer is removed to expose the covering layer 80. By using such a step to remove excess molding compound pre-layer, stress during plastic sealing can be effectively controlled, so that the base plate, the chip stacking structure and the interposer can be prevented from being warped to affect package stability.

Figure 6H:
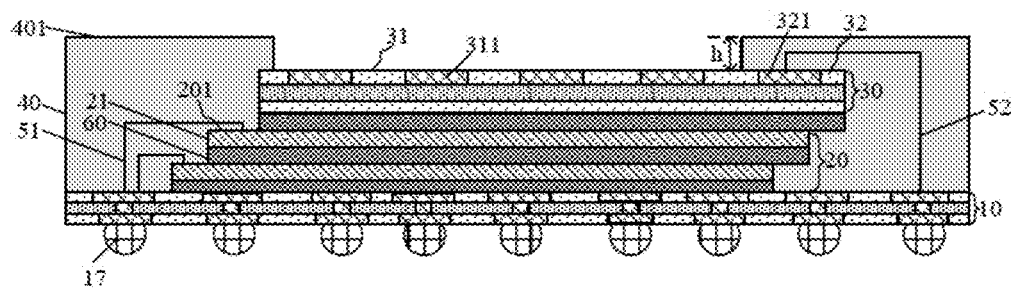

Next, referring to FIG. 6H, the covering layer 80 is removed to expose the first interconnection region 31.

Specifically, the step of removing the covering layer 80 includes: using a chemical solution to remove the covering layer 80. The used chemical solution may dissolve the covering layer, but does not cause losses to structures such as the chip and the molding compound.

Also referring to FIG. 6H, after the molding compound 40 is formed, the base plate connection bump 17 is formed on the second surface 102 of the base plate 10. The base plate connection bump 17 includes a conductive material.

Figure 6I:
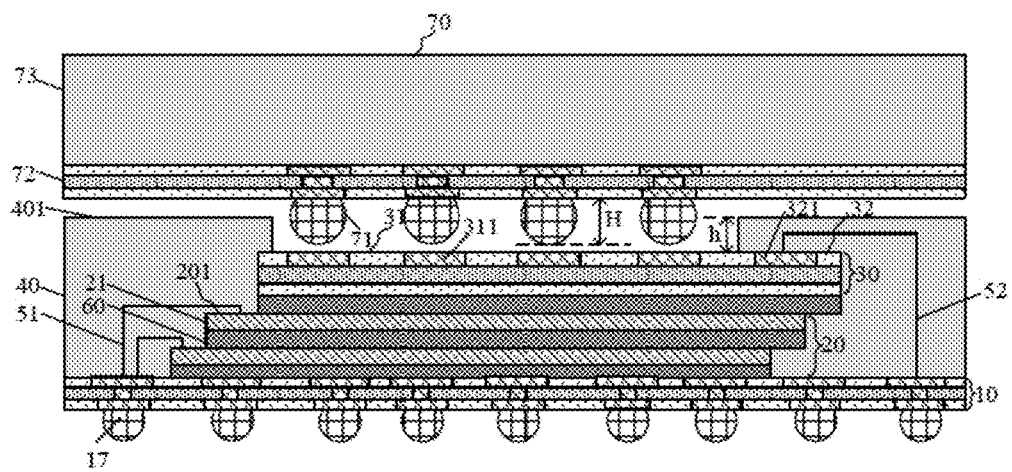

Next, referring to FIG. 6I, the method further includes: forming a second package structure 70, and forming a first solder ball 71 on the second package structure 70. The first solder ball 71 is electrically connected to the first interconnection region 31. A height H of the first solder ball 71 is greater than the preset height h.

In this embodiment of the disclosure, by designing the height of the first solder ball to be greater than the height between the top surface of the molding compound and the first interconnection region, the second package structure can be tightly connected to the interposer. In addition, after the second package structure is connected to the interposer, there may be a gap between the second package structure and the molding compound. Therefore, the heat dissipation efficiency of a controller can be enhanced, and the impact of heat on chips can be reduced.

The second package structure 70 further includes a second base plate 72. A structure of the second base plate 72 may be the same as a structure of the base plate 10, which is not described herein again.

In an embodiment, in the direction perpendicular to the base plate 10, the molding compound 40 has a first thickness. The second package structure 70 includes a second molding compound 73. In the direction perpendicular to the base plate 10, the second molding compound 73 has a second thickness. The first thickness is greater than or equal to the second thickness.

The second package structure 70 further includes a second chip structure (not show). The type of the second chip structure is the same as or different from the type of the chip stacking structure 20.

For example, the second chip structure may be a Universal File Store (UFS) chip.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

INDUSTRIAL APPLICABILITY

In the embodiments of the disclosure, through the arrangement of the interposer, the subsequent second package structure may be connected to the chip stacking structure and the base plate via the first interconnection region on the interposer. Therefore, the interconnection among the chip structures of different types or different specifications can be realized, so as to cause a combination among different chip structures to be more flexible. In addition, since the chip stacking structure and the second package structure subsequently connected to the chip stacking structure are packaged independently, test and failure analysis are easier to perform. Since there is the preset height between the first interconnection region of the interposer and the top surface of the molding compound, the second package structure may be placed on the first interconnection region, within a region enclosed by the molding compound, so that the height and size of the entire structure can be reduced.

The invention claimed is:

1. A semiconductor package assembly, comprising:
a base plate, having a first surface; the base plate further comprising a first signal transmission region and a second signal transmission region that are respectively located on two opposite sides of the base plate, a third signal transmission region located between the first signal transmission region and the second signal transmission region; the first signal transmission region and the third signal transmission region are connected to each other, the third signal transmission region and the second signal transmission region are not connected to each other;
a chip stacking structure, located on the third signal transmission region, wherein the chip stacking structure comprises a plurality of chips sequently stacked in a direction perpendicular to the base plate, and is electrically connected to the first surface of the base plate;
an interposer, located on the chip stacking structure and having a first interconnection surface, wherein the first interconnection surface has a first interconnection region and a second interconnection region, and the first interconnection region is electrically connected to the base plate; the first signal transmission region is electrically connected to the chip stacking structure, the second signal transmission region is electrically connected to the interposer;
each chip has a first connection end, the first connection end and the first signal transmission region are located on the same side, a first conductive wire is led out from the first connection end to the first signal transmission region;
a second pad is formed on the second interconnection region, a second conductive wire is led out from the second pad to the second signal transmission region; and
a molding compound, sealing the chip stacking structure, the interposer and the first surface of the base plate, wherein the first interconnection region is not sealed by the molding compound, the second interconnection region is sealed by the molding compound, and there is a preset height between a top surface of the molding compound on the second interconnection region and the first interconnection region.

2. The semiconductor package assembly of claim 1, wherein
the first interconnection region comprises a plurality of first pads; the second interconnection region comprises a plurality of second pads; a number of the second pads is greater than a number of the first pads; and an area of the second pad is less than an area of the first pad.

3. The semiconductor package assembly of claim 2, wherein
the first pads are not sealed by the molding compound, the second pads are sealed by the molding compound.

4. The semiconductor package assembly of claim 1, wherein
an included angle between a sidewall between the top surface of the molding compound and the first interconnection region and a direction perpendicular to the base plate is a first included angle; and the first included angle is greater than or equal to 0° and less than 90°.

5. The semiconductor package assembly of claim 1, wherein
in a direction perpendicular to the base plate, the base plate has a first thickness, and the interposer has a second thickness; and the first thickness is greater than the second thickness.

6. The semiconductor package assembly of claim 1, further comprising:
a second package structure, comprising a first solder ball, wherein the first solder ball is electrically connected to the first interconnection region, and a height of the first solder ball is greater than the preset height.

7. The semiconductor package assembly of claim 6, wherein
a gap is between the second package structure and the molding compound.

8. A method for manufacturing a semiconductor package assembly, comprising:
providing a base plate, wherein the base plate has a first surface; the base plate further comprising a first signal transmission region and a second signal transmission region that are respectively located on two opposite sides of the base plate, a third signal transmission region located between the first signal transmission region and the second signal transmission region; the first signal transmission region and the third signal transmission region are connected to each other, the third signal transmission region and the second signal transmission region are not connected to each other;
forming a chip stacking structure on the third signal transmission region, wherein the chip stacking structure comprises a plurality of chips sequently stacked in a direction perpendicular to the base plate, and is electrically connected to the first surface of the base plate;
forming an interposer on the chip stacking structure, wherein the interposer has a first interconnection surface, the first interconnection surface has a first interconnection region and a second interconnection region, and the first interconnection region is electrically connected to the base plate; the first signal transmission region is electrically connected to the chip stacking structure, the second signal transmission region is electrically connected to the interposer;

each chip has a first connection end, the first connection end and the first signal transmission region are located on the same side, a first conductive wire is led out from the first connection end to the first signal transmission region;

a second pad is formed on the second interconnection region, a second conductive wire is led out from the second pad to the second signal transmission region; and forming a molding compound, wherein the molding compound seals the chip stacking structure, the interposer and the first surface of the base plate, wherein the first interconnection region is not sealed by the molding compound, the second interconnection region is sealed by the molding compound, and there is a preset height between a top surface of the molding compound on the second interconnection region and the first interconnection region.

9. The method of claim 8, wherein the forming an interposer on the chip stacking structure comprises:

providing the interposer, wherein a bottom of the interposer is provided with an adhesive layer, and the interposer is adhered to the chip stacking structure via the adhesive layer.

10. The method of claim 8, further comprising:

forming a plurality of first pads on the first interconnection region; and forming a plurality of second pads on the second interconnection region, wherein a number of the second pads is greater than a number of the first pads, and an area of the second pad is less than an area of the first pad.

11. The method of claim 8, further comprising:

forming the interposer, and then forming a covering layer with a preset height on the first interconnection region of the interposer, wherein an included angle between a sidewall of the covering layer and the direction perpendicular to the base plate is a first included angle; and the first included angle is greater than or equal to 0° and less than 90°.

12. The method of claim 11, further comprising:

forming the covering layer, and then forming a first packaging mold, wherein a surface of the first packaging mold is parallel to a surface of the base plate, the first packaging mold is located above the covering layer and has a certain distance from the covering layer.

13. The method of claim 12, further comprising:

forming a molding compound pre-layer for sealing the chip stacking structure, the interposer, the covering layer and the first surface of the base plate by using the first packaging mold as a mask;

exposing the covering layer by removing part of the molding compound pre-layer; and exposing the first interconnection region by removing the covering layer.

14. The method of claim 8, further comprising:

forming a second package structure, and forming a first solder ball on the second package structure, wherein the first solder ball is electrically connected to the first interconnection region, and a height of the first solder ball is greater than the preset height.

* * * * *